US012637055B2

(12) United States Patent
Yi et al.

(10) Patent No.: US 12,637,055 B2
(45) Date of Patent: *May 26, 2026

(54) APPARATUS FOR DIAGNOSING A BATTERY OF A VEHICLE AND METHOD THEREOF

(71) Applicants: Hyundai Motor Company, Seoul (KR); Kia Corporation, Seoul (KR)

(72) Inventors: Jae Shin Yi, Seoul (KR); Sang Jin Park, Bucheon (KR); Tae Kyu Kang, Seoul (KR); Byung Soo Park, Daejeon (KR); Woo Sung Kim, Suwon (KR); Soo Youn Park, Anyang (KR)

(73) Assignees: Hyundai Motor Company, Seoul (KR); Kia Corporation, Seoul (KR)

( * ) Notice: Subject to any disclaimer, the term of this patent is extended or adjusted under 35 U.S.C. 154(b) by 877 days.

This patent is subject to a terminal disclaimer.

(21) Appl. No.: 17/891,440

(22) Filed: Aug. 19, 2022

(65) Prior Publication Data

US 2023/0294659 A1 Sep. 21, 2023

(30) Foreign Application Priority Data

Mar. 21, 2022 (KR) ........................ 10-2022-0034838

(51) Int. Cl.
*B60W 10/26* (2006.01)
*B60R 16/023* (2006.01)
(Continued)

(52) U.S. Cl.
CPC ......... *B60W 10/26* (2013.01); *B60R 16/0231* (2013.01); *G01R 31/3648* (2013.01);
(Continued)

(58) Field of Classification Search
CPC .............. B60R 16/0231; B60W 10/26; G01R 31/3648; G01R 31/367; G01R 31/3842;
(Continued)

(56) References Cited

U.S. PATENT DOCUMENTS 12,142,090 B2 * 11/2024 Yi ............................. B60L 3/12
2011/0234166 A1 * 9/2011 Liu ....................... G01R 31/396
320/132

(Continued)

FOREIGN PATENT DOCUMENTS

JP 2012-103095 A 5/2012
KR 10-2021-0111128 A 9/2021

*Primary Examiner* — Michael J Dalbo
(74) *Attorney, Agent, or Firm* — Fox Rothschild LLP

(57) ABSTRACT

Disclosed are an apparatus and method for diagnosing a battery of a vehicle. The apparatus includes storage that stores a threshold value for each accumulated driving distance section corresponding to a state of the vehicle, and a controller that collects vehicle state information and battery state information from a plurality of vehicles, determines a maximum voltage difference change rate of a battery cell for an accumulated driving distance for each vehicle, and diagnoses an abnormality in a battery provided in each vehicle based on the maximum voltage difference change rate of the battery cell for the accumulated driving distance of each vehicle and a threshold value corresponding to the maximum voltage difference change rate.

8 Claims, 8 Drawing Sheets

(51) Int. Cl.

| | |
|---|---|
| *G01R 31/36* | (2020.01) |
| *G01R 31/3842* | (2019.01) |
| *H01M 10/42* | (2006.01) |

(52) U.S. Cl.

CPC ...... *G01R 31/3842* (2019.01); *H01M 10/425* (2013.01); *H01M 2010/4271* (2013.01); *H01M 2010/4278* (2013.01); *H01M 2220/20* (2013.01)

(58) Field of Classification Search

CPC .............. G01R 31/392; H01M 10/425; H01M 10/4271; H01M 2010/4278; H01M 2220/20

See application file for complete search history.

(56) References Cited

U.S. PATENT DOCUMENTS

| | | | |
|---|---|---|---|
| 2012/0296512 | A1 | 11/2012 | Lee et al. |
| 2014/0145678 | A1* | 5/2014 | Hwang ..................... H02J 3/32 |
| | | | 320/118 |
| 2017/0259687 | A1 | 9/2017 | Chikkannanavar et al. |
| 2018/0267109 | A1 | 9/2018 | Kutkut |
| 2020/0332755 | A1 | 10/2020 | Miyashita et al. |
| 2020/0364661 | A1 | 11/2020 | Yamasaki |
| 2021/0156921 | A1 | 5/2021 | Kazuno et al. |
| 2021/0323419 | A1 | 10/2021 | Maruno et al. |
| 2022/0128631 | A1* | 4/2022 | Zhang ..................... B60L 58/22 |
| 2022/0381848 | A1* | 12/2022 | Ho ....................... G01R 31/367 |

* cited by examiner

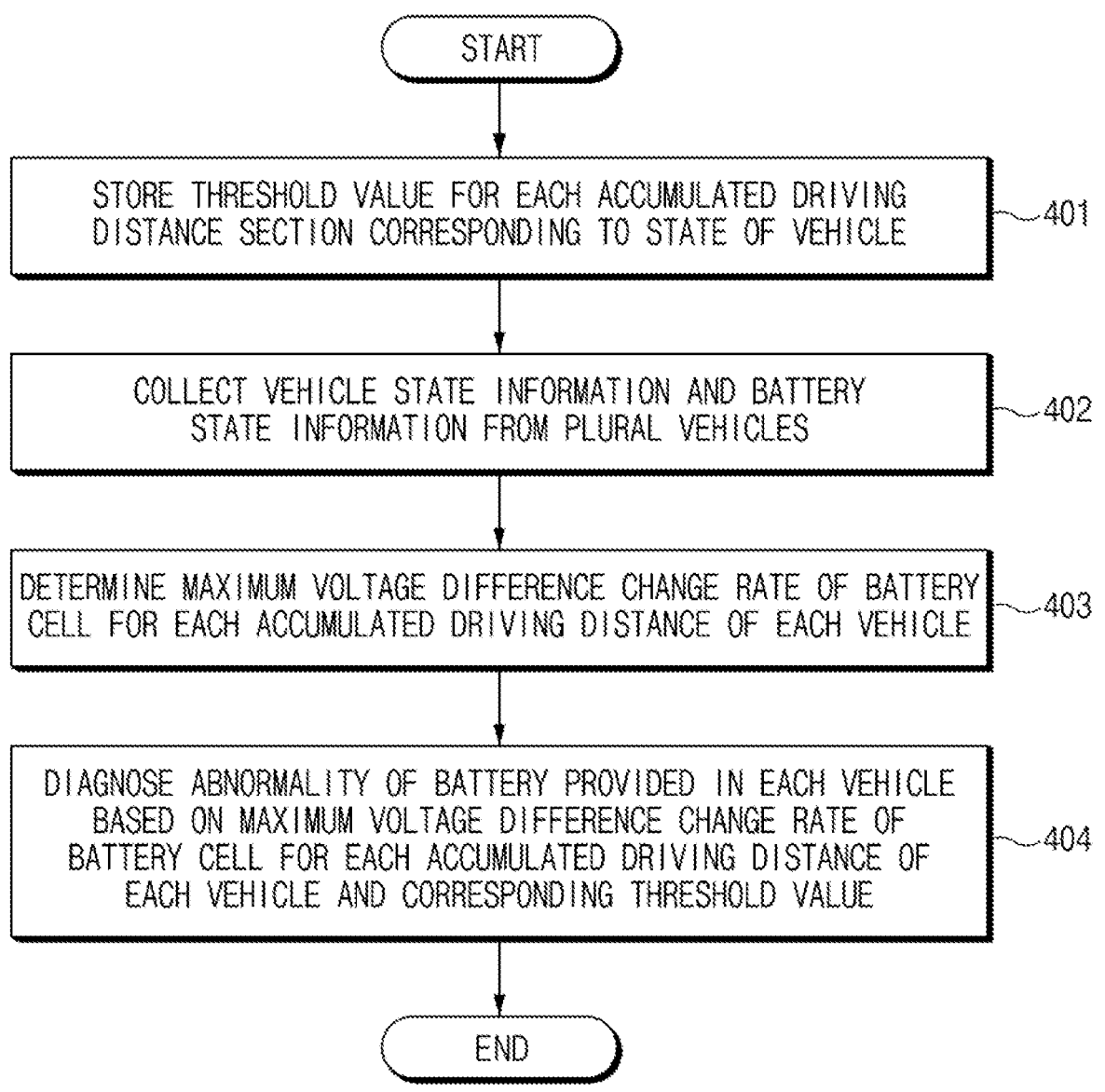

START

STORE THRESHOLD VALUE FOR EACH ACCUMULATED DRIVING DISTANCE SECTION CORRESPONDING TO STATE OF VEHICLE ~401

COLLECT VEHICLE STATE INFORMATION AND BATTERY STATE INFORMATION FROM PLURAL VEHICLES ~402

DETERMINE MAXIMUM VOLTAGE DIFFERENCE CHANGE RATE OF BATTERY CELL FOR EACH ACCUMULATED DRIVING DISTANCE OF EACH VEHICLE ~403

DIAGNOSE ABNORMALITY OF BATTERY PROVIDED IN EACH VEHICLE BASED ON MAXIMUM VOLTAGE DIFFERENCE CHANGE RATE OF BATTERY CELL FOR EACH ACCUMULATED DRIVING DISTANCE OF EACH VEHICLE AND CORRESPONDING THRESHOLD VALUE ~404

END

FIG. 4

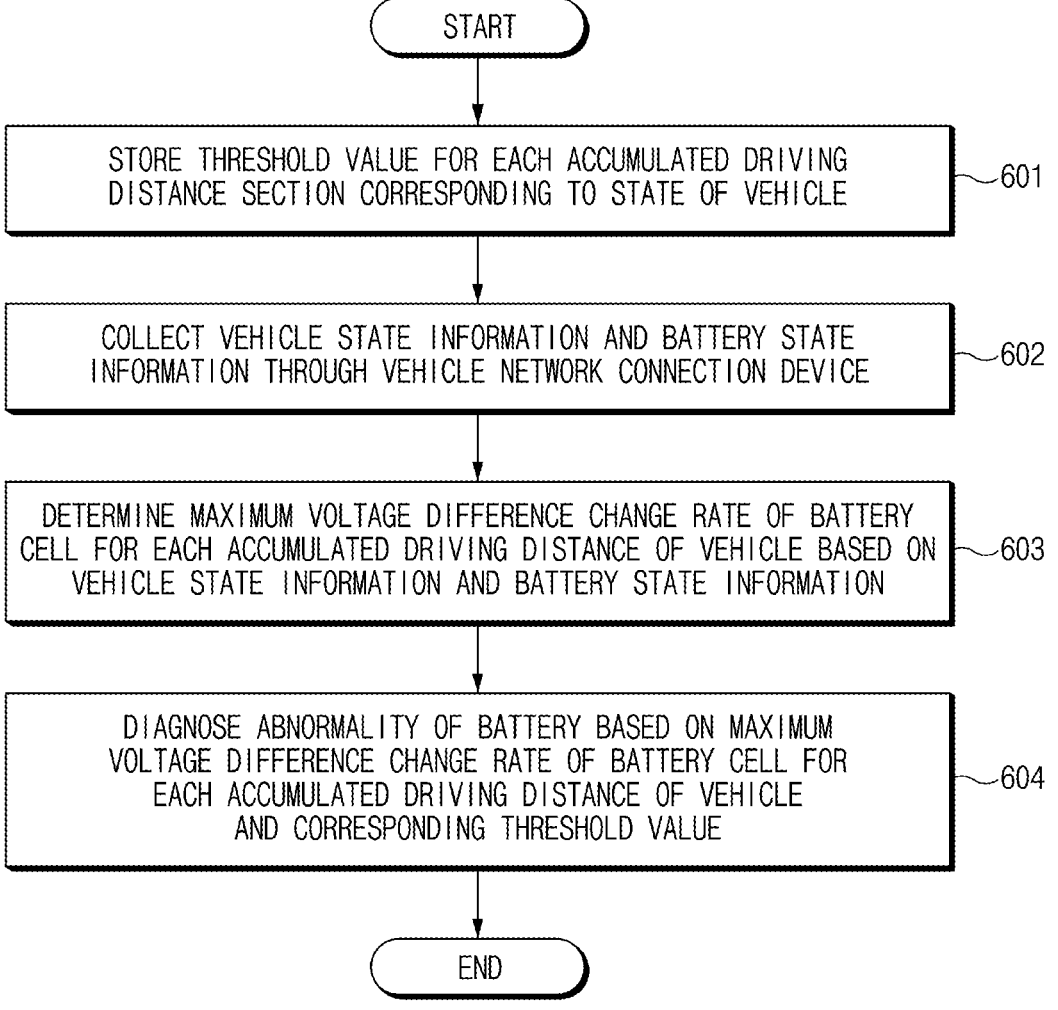

START

STORE THRESHOLD VALUE FOR EACH ACCUMULATED DRIVING
DISTANCE SECTION CORRESPONDING TO STATE OF VEHICLE — 601

COLLECT VEHICLE STATE INFORMATION AND BATTERY STATE
INFORMATION THROUGH VEHICLE NETWORK CONNECTION DEVICE — 602

DETERMINE MAXIMUM VOLTAGE DIFFERENCE CHANGE RATE OF BATTERY
CELL FOR EACH ACCUMULATED DRIVING DISTANCE OF VEHICLE BASED ON — 603
VEHICLE STATE INFORMATION AND BATTERY STATE INFORMATION

DIAGNOSE ABNORMALITY OF BATTERY BASED ON MAXIMUM
VOLTAGE DIFFERENCE CHANGE RATE OF BATTERY CELL FOR
EACH ACCUMULATED DRIVING DISTANCE OF VEHICLE — 604
AND CORRESPONDING THRESHOLD VALUE

END

FIG.6

APPARATUS FOR DIAGNOSING A BATTERY OF A VEHICLE AND METHOD THEREOF

CROSS-REFERENCE TO RELATED APPLICATION

This application is based on and claims under 35 U.S.C. § 119(a) the benefit of Korean Patent Application No. 10-2022-0034838, filed in the Korean Intellectual Property Office on Mar. 21, 2022, the entire contents of which are incorporated herein by reference.

TECHNICAL FIELD

Embodiments of the present disclosure relate to a technology for diagnosing the state of a battery provided in each vehicle based on big data.

BACKGROUND

In general, an electric vehicle is a vehicle driven by electric energy as a power, and includes a battery having a plurality of battery cells for storing electric energy.

Such a battery cell converts chemical energy into electrical energy to supply electrical energy (discharge), or converts and store electrical energy supplied from an outside into chemical energy (charge).

Because an electric vehicle is driven by using the electric energy stored in a battery as a power source, the performance of the vehicle depends on the performance of the battery. Therefore, in order to improve the performance of an electric vehicle, it is necessary to manage a battery to maximize the performance of a battery.

Recently, because a battery cell having excellent performance is used to improve the power source of a vehicle and the number of battery cells has been gradually increased, the need for battery management has been further required. Such battery management is generally performed by a battery management system (BMS).

The battery management system may measure cell state information such as voltage, current, and temperature of a battery cell from a battery module provided in an electric vehicle, use the cell state information and an option value for controlling the battery cells to manage charging and discharging of each battery cell, and perform cell balancing to maintain a balance among a plurality of battery cells.

In this case, the cell balancing is one of the control operations of the battery management system for uniformizing the voltage or charge amount of the battery cells. Even when the battery cells of a battery module are manufactured under the same manufacturing conditions and the same environment, there may be differences in electrical characteristics. In addition, although the battery cells of the battery module are mounted in an electric vehicle and operated, there may be differences in electrical characteristics.

Due to such a difference in electrical characteristics, even when battery cells are charged and discharged with the same current, voltage imbalance or residual charge imbalance between the interconnected battery cells occurs. The voltage imbalance or residual charge imbalance between battery cells may cause the usable voltage range of the battery cells to decrease or the charging and discharging cycle to shorten.

A conventional battery management system diagnoses whether a battery provided in a vehicle is abnormal based on a cell voltage difference and insulation resistance of the battery. That is, according to the related art, it is determined whether a battery is abnormal based on sensor data at the time of diagnosis and a diagnosis condition. In this case, it is difficult to set the diagnosis condition, and in particular, it is impossible to diagnose a battery defect that may cause a fatal event (e.g., fire) under conventional diagnostic conditions.

The matters described in this background section are intended to promote an understanding of the background of the disclosure and may include matters that are not already known to those of ordinary skill in the art.

SUMMARY

An embodiment of the present disclosure provides an apparatus and method for diagnosing a battery of a vehicle capable of diagnosing in advance a defect in a battery that may cause a fire in the vehicle, where the apparatus has a threshold value for each accumulated driving distance section corresponding to the state of the vehicle, collects vehicle state information and battery state information from a plurality of vehicles, determines the maximum voltage difference change rate of the battery cell for each accumulated driving distance for each vehicle, and diagnoses an abnormality in the battery provided in each vehicle based on a maximum voltage difference change rate of a battery cell for each accumulated driving distance of each vehicle and a corresponding threshold value.

The technical objects of the present disclosure are not limited to the above-mentioned one, and the other unmentioned technical objects and advantages will become apparent from the following description. Also, it may be easily understood that the objects and advantages of the present disclosure may be realized by the units and combinations thereof recited in the claims.

According to an embodiment of the present disclosure, an apparatus for diagnosing a battery of a vehicle includes storage that stores a threshold value for each accumulated driving distance section corresponding to a state of the vehicle, and a controller that collects vehicle state information and battery state information from a plurality of vehicles, determines a maximum voltage difference change rate of a battery cell for an accumulated driving distance for each vehicle, and diagnoses an abnormality in a battery provided in each vehicle based on the maximum voltage difference change rate of the battery cell for the accumulated driving distance of each vehicle and a threshold value corresponding to the maximum voltage difference change rate.

According to an exemplary embodiment, the controller may collect at least one of charging, parking, driving and the accumulated driving distance as the vehicle state information.

According to an exemplary embodiment, the controller may collect at least one of voltage, current, and temperature of the battery cell as the battery state information.

According to an exemplary embodiment, the controller may determine a difference between a maximum voltage and a minimum voltage of the battery cell at a previous time point and a current time point as a maximum voltage difference, divide a difference between the maximum voltage difference at the current time point and the maximum voltage difference at the previous time point by a difference between an accumulated driving distance at the current time point and an accumulated driving distance at the previous time point, and determine a dividing result as the maximum voltage difference change rate of the battery cell corresponding to the accumulated driving distance at the present time point.

According to an exemplary embodiment, the controller may determine a threshold value corresponding to the state of each vehicle and the accumulated driving distance, compare the maximum voltage difference change rate of the battery cell for the accumulated driving distance of each vehicle with the threshold value corresponding to each vehicle, and diagnose that an abnormality occurs in the battery of the vehicle exceeding the threshold value.

According to an exemplary embodiment, the controller may diagnose the battery when a state of charge (SOC) of the battery satisfies a first reference range, a temperature of the battery satisfies a second reference range, and a current of the battery satisfies a third reference range.

According to an exemplary embodiment, the controller may diagnose a battery of a vehicle, a driving distance of which exceeds a reference distance.

According to another embodiment of the present disclosure, a method of diagnosing a battery of a vehicle includes storing, by storage a threshold value for each accumulated driving distance section corresponding to a state of the vehicle, collecting, by a controller, vehicle state information and battery state information from a plurality of vehicles, determining, by the controller, a maximum voltage difference change rate of a battery cell for an accumulated driving distance for each vehicle, and diagnosing, by the controller, an abnormality in a battery provided in each vehicle based on the maximum voltage difference change rate of the battery cell for the accumulated driving distance of each vehicle and a threshold value corresponding to the maximum voltage difference change rate.

According to an exemplary embodiment, the collecting of the vehicle state information and the battery state information may include collecting at least one of charging, parking, driving and the accumulated driving distance as the vehicle state information.

According to an exemplary embodiment, the collecting of the vehicle state information and the battery state information may include collecting at least one of voltage, current, and temperature of the battery cell as the battery state information.

According to an exemplary embodiment, the determining of the maximum voltage difference change rate may include determining a difference between a maximum voltage and a minimum voltage of the battery cell at a previous time point and a current time point as a maximum voltage difference, dividing a difference between the maximum voltage difference at the current time point and the maximum voltage difference at the previous time point by a difference between an accumulated driving distance at the current time point and an accumulated driving distance at the previous time point, and determining a dividing result as the maximum voltage difference change rate of the battery cell corresponding to the accumulated driving distance at the present time point.

According to an exemplary embodiment, the diagnosing of the abnormality may include determining a threshold value corresponding to a state of each vehicle and the accumulated driving distance, comparing the maximum voltage difference change rate of the battery cell for the accumulated driving distance of each vehicle with the threshold value corresponding to each vehicle, and diagnosing that an abnormality occurs in the battery of the vehicle exceeding the threshold value.

According to an exemplary embodiment, the diagnosing of the abnormality may include determining the diagnosing of the battery when a state of charge (SOC) of the battery satisfies a first reference range, a temperature of the battery satisfies a second reference range, and a current of the battery satisfies a third reference range.

According to an exemplary embodiment, the diagnosing of the abnormality may include determining the diagnosing of a battery of a vehicle, a driving distance of which exceeds a reference distance.

According to still another embodiment of the present disclosure, an apparatus for diagnosing a battery of a vehicle includes the battery, a vehicle network connection device, storage configured to store a threshold value for each accumulated driving distance section corresponding to a state of the vehicle, and a controller configured to collect vehicle state information and battery state information through the vehicle network connection device, determine a maximum voltage difference change rate of a battery cell for an accumulated driving distance of the vehicle, and diagnose an abnormality in a battery based on the maximum voltage difference change rate of the battery cell for the accumulated driving distance of the vehicle and a threshold value corresponding to the maximum voltage difference change rate.

According to an exemplary embodiment, the controller may collect at least one of charging, parking, driving and the accumulated driving distance as the vehicle state information.

According to an exemplary embodiment, the controller may collect at least one of voltage, current, and temperature of the battery cell as the battery state information.

According to an exemplary embodiment, the controller may determine a difference between a maximum voltage and a minimum voltage of the battery cell at a previous time point and a current time point as a maximum voltage difference, divide a difference between the maximum voltage difference at the current time point and the maximum voltage difference at the previous time point by a difference between an accumulated driving distance at the current time point and an accumulated driving distance at the previous time point, and determine a dividing result as the maximum voltage difference change rate of the battery cell corresponding to the accumulated driving distance at the present time point.

According to an exemplary embodiment, the controller may determine a threshold value corresponding to the state of the vehicle and the accumulated driving distance, compare the maximum voltage difference change rate of the battery cell for the accumulated driving distance of the vehicle with the threshold value, and diagnose that an abnormality occurs in the battery when the maximum voltage difference change rate exceeds the threshold value.

According to an exemplary embodiment, the controller may diagnose the battery when a state of charge (SOC) of the battery satisfies a first reference range, a temperature of the battery satisfies a second reference range, and a current of the battery satisfies a third reference range.

As discussed, the method and system suitably include use of a controller or processer.

In another embodiment, vehicles are provided that comprise an apparatus as disclosed herein.

BRIEF DESCRIPTION OF THE DRAWINGS

The above and other objects, features and advantages of the present disclosure will be more apparent from the following detailed description taken in conjunction with the accompanying drawings:

FIG. 4 is a flowchart illustrating a method of diagnosing a battery of a vehicle according to an exemplary embodiment of the present disclosure;

FIG. 6 is a flowchart illustrating a method of diagnosing a battery of a vehicle according to another embodiment of the present disclosure.

DETAILED DESCRIPTION

Figure 1:
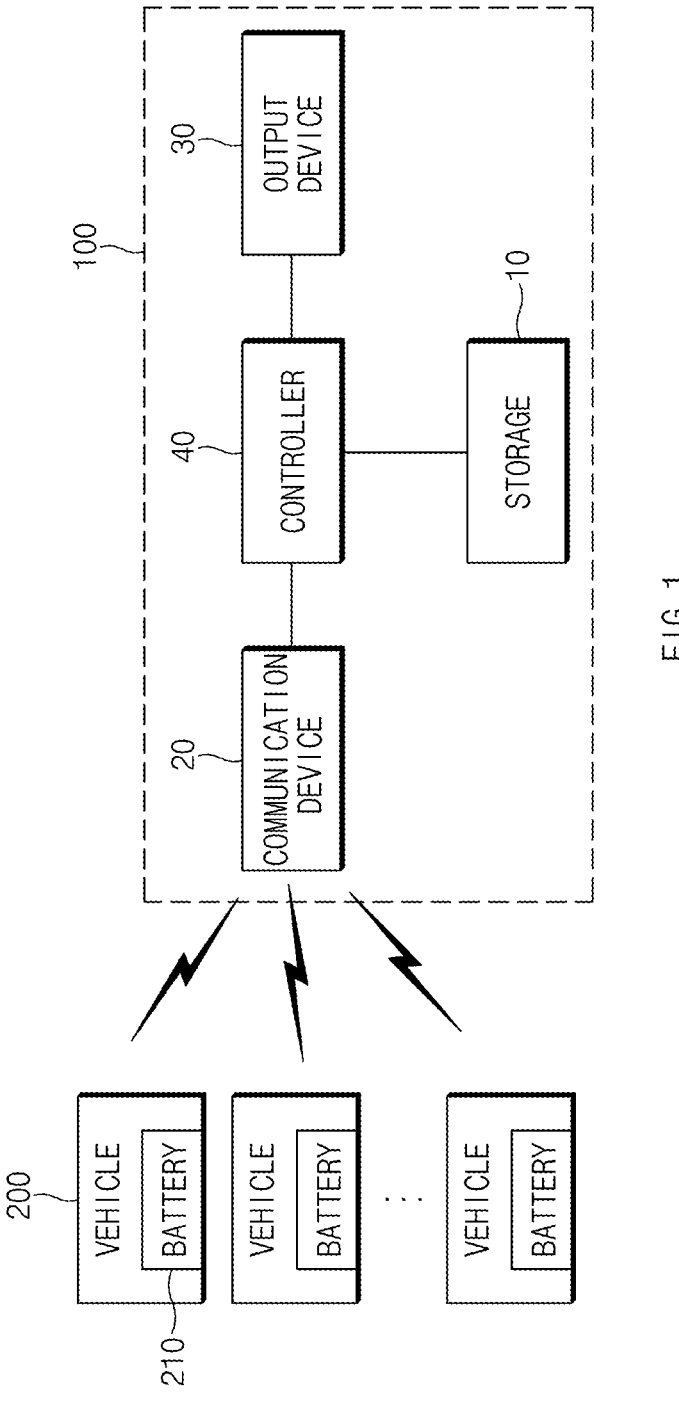
FIG. 1 is a block diagram illustrating an apparatus for diagnosing a battery of a vehicle according to an exemplary embodiment of the present disclosure.

Hereinafter, some embodiments of the present disclosure will be described in detail with reference to the exemplary drawings. In adding the reference numerals to the components of each drawing, it should be noted that the identical or equivalent component is designated by the identical numeral even when they are displayed on other drawings. Further, in describing the embodiment of the present disclosure, a detailed description of the related known configuration or function will be omitted when it is determined that it interferes with the understanding of the embodiment of the present disclosure.

In describing the components of the embodiment according to the present disclosure, terms such as first, second, A, B, (a), (b), and the like may be used. These terms are merely intended to distinguish the components from other components, and the terms do not limit the nature, order or sequence of the components.

It is understood that the term "vehicle" or "vehicular" or other similar term as used herein is inclusive of motor vehicles in general such as passenger automobiles including sports utility vehicles (SUV), buses, trucks, various commercial vehicles, watercraft including a variety of boats and ships, aircraft, and the like, and includes hybrid vehicles, electric vehicles, plug-in hybrid electric vehicles, hydrogen-powered vehicles and other alternative fuel vehicles (e.g. fuels derived from resources other than petroleum). As referred to herein, a hybrid vehicle is a vehicle that has two or more sources of power, for example both gasoline-powered and electric-powered vehicles.

The terminology used herein is for the purpose of describing particular embodiments only and is not intended to be limiting of the disclosure. As used herein, the singular forms "a," "an" and "the" are intended to include the plural forms as well, unless the context clearly indicates otherwise. These terms are merely intended to distinguish one component from another component, and the terms do not limit the nature, sequence or order of the constituent components. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Throughout the specification, unless explicitly described to the contrary, the word "comprise" and variations such as "comprises" or "comprising" will be understood to imply the inclusion of stated elements but not the exclusion of any other elements. In addition, the terms "unit", "-er", "-or", and "module" described in the specification mean units for processing at least one function and operation, and can be implemented by hardware components or software components and combinations thereof.

Although exemplary embodiment is described as using a plurality of units to perform the exemplary process, it is understood that the exemplary processes may also be performed by one or plurality of modules. Additionally, it is understood that the term controller/control unit refers to a hardware device that includes a memory and a processor and is specifically programmed to execute the processes described herein. The memory is configured to store the modules and the processor is specifically configured to execute said modules to perform one or more processes which are described further below.

Further, the control logic of the present disclosure may be embodied as non-transitory computer readable media on a computer readable medium containing executable program instructions executed by a processor, controller or the like. Examples of computer readable media include, but are not limited to, ROM, RAM, compact disc (CD)-ROMs, magnetic tapes, floppy disks, flash drives, smart cards and optical data storage devices. The computer readable medium can also be distributed in network coupled computer systems so that the computer readable media is stored and executed in a distributed fashion, e.g., by a telematics server or a Controller Area Network (CAN).

Unless otherwise defined, all terms including technical and scientific terms used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a block diagram illustrating an apparatus for diagnosing a battery of a vehicle according to an exemplary embodiment of the present disclosure, which may be implemented, for example, in the form of a server.

As shown in FIG. 1, an apparatus 100 for diagnosing a battery of a vehicle according to an exemplary embodiment of the present disclosure may include storage 10, a communication device 20, an output device 30, and a controller 40. In this case, depending on a scheme of implementing the apparatus 100 for diagnosing a battery of a vehicle according to an exemplary embodiment of the present disclosure, components may be combined with each other to be implemented as one, or some components may be omitted.

Regarding each component, the storage 10 may store various logic, algorithms and programs required in the processes of providing a threshold value for each accumulated driving distance section corresponding to the state of a vehicle, collecting vehicle state information and battery state information from a plurality of vehicles 200, determining the maximum voltage difference change rate of the battery cell for each accumulated driving distance for each vehicle 200, and diagnosing an abnormality in the battery provided in each vehicle 200 based on the maximum voltage difference change rate of a battery cell for each accumulated driving distance of each vehicle 200 and a corresponding threshold value.

The storage 10 may store the maximum voltage difference change rate of the battery cell for each accumulated driving distance of each vehicle 200. That is, the storage 10 may store the history of the maximum voltage difference change rate of the battery cell for each accumulated driving distance of each vehicle 200.

The storage 10 may store a graph 250 in which a threshold value for each accumulated driving distance section corresponding to a vehicle state (e.g., driving, charging, parking, or the like) is recorded. That is, the storage 10 may store a threshold value for each accumulated driving distance section applied when the vehicle is driving, a threshold value for each accumulated driving distance section applied when the vehicle is charging, and a threshold value for each accumulated driving distance section applied when the vehicle is being parked. For example, the graph 250 is as shown in FIG. 2.

Figure 2:
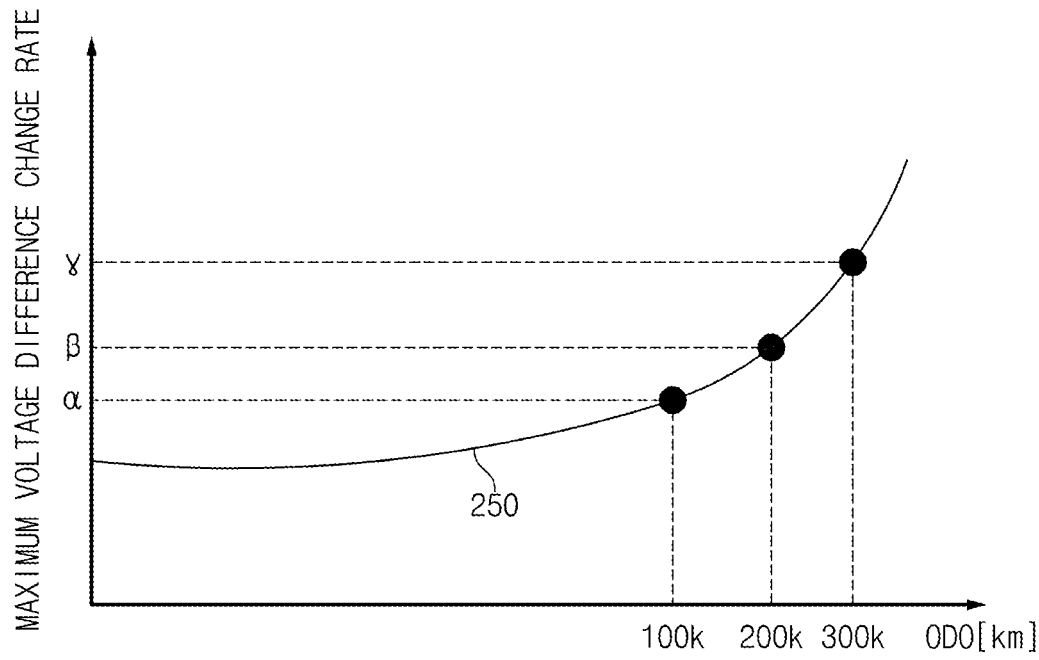
FIG. 2 is a view illustrating a threshold value for each accumulated driving distance section corresponding to the state of a vehicle provided in an apparatus for diagnosing a battery of a vehicle according to an exemplary embodiment of the present disclosure.

FIG. 2 is a view illustrating a threshold value for each accumulated driving distance section corresponding to the state of a vehicle provided in an apparatus for diagnosing a battery of a vehicle according to an exemplary embodiment of the present disclosure, which may be applied to a vehicle being charged or parked.

As shown in FIG. 2, the vertical axis represents the maximum voltage difference change rate of a battery cell, and the horizontal axis represents the accumulated driving distance (total driving distance) recorded by an odometer of the vehicle 200. In this case, the accumulated driving distance may be divided into a plurality of sections for efficient data processing. For example, a first section may be set to 100,000 km or less, a second section may be set to more than 100,000 km and 200,000 km or less, and a third section may be set to be more than 200,000 km and 300,000 km or less.

In FIG. 2, reference numeral '250' represents a threshold value graph for the maximum voltage difference change rate of the battery cell for each accumulated driving distance, 'α' denotes a threshold value corresponding to the first interval, 'β' denotes a threshold value corresponding to the second section, and 'γ' denotes a threshold value corresponding to the third section. In this case, the 'α' may be, for example, 0.54 mV/km, the 'β' may be, for example, 0.72 mV/km, and the 'γ' may be, for example, 1.2 mV/km.

The storage 10 may further store a threshold value (e.g., 3.00 mV/km) applied when the vehicle is driving. In this case, the threshold value applied when the vehicle is driving may be set to a single value regardless of the accumulated driving distance of the vehicle.

The storage 10 may include at least one type of a storage medium of memories of a flash memory type, a hard disk type, a micro type, a card type (e.g., a secure digital (SD) card or an extreme digital (XD) card), and the like, and a random access memory (RAM), a static RAM, a read-only memory (ROM), a programmable ROM (PROM), an electrically erasable PROM (EEPROM), a magnetic memory (MRAM), a magnetic disk, and an optical disk type memory.

The communication device 20, which is a module for providing a communication interface with telematics terminals (not shown) provided in the plurality of vehicles 200, may receive vehicle state information and battery state information from the telematics terminals. The communication device 20 may include at least one of a mobile communication module, a wireless Internet module, and a short-range communication module.

The mobile communication module may communicate with the telematics terminals through a mobile communication network constructed according to a technical standard or communication scheme for mobile communication (e.g., global system for mobile communication (GSM), code division multi access (CDMA), code division multi access 2000 (CDMA2000), enhanced voice-data optimized or enhanced voice-data only (EV-DO), wideband CDMA (WCDMA), high speed downlink packet access (HSDPA), high speed uplink packet access (HSDPA), long term evolution (LTE), long term evolution-advanced (LTEA), and the like.

The wireless Internet module, which is a module for wireless Internet access, may communicate with the telematics terminal through wireless LAN (WLAN), wireless-fidelity (Wi-Fi), Wi-Fi direct, digital living network alliance (DLNA), wireless broadband (WiBro), world interoperability for microwave access (WiMAX), high speed downlink packet access (HSDPA), high speed uplink packet access (HSDPA), long term evolution (LTE), long term evolution-advanced (LTE-A), and the like.

The short-range communication module may support short-range communication with the telematics terminal by using at least one of Bluetooth™, radio frequency identification (RFID), infrared data association (IrDA), ultra wideband (UWB), ZigBee, near field communication (NFC), and wireless universal serial bus (USB) technology.

The output device 30, which is a module for warning of an abnormality in a battery 210 provided in each vehicle 200, may include a visual waning module and an audible warning module.

The controller 40 may perform overall control such that each component performs its function. The controller 40 may be implemented in the form of hardware or software, or may be implemented in a combination of hardware and software. Preferably, the controller 40 may be implemented as a microprocessor, but is not limited thereto.

In particular, the controller 40 may perform various controls required in the processes of providing a threshold value for each accumulated driving distance section corresponding to the state of the vehicle, collecting the vehicle state information and the battery state information from the plurality of vehicles 200, determining the maximum voltage difference change rate of a battery cell for an accumulated driving distance for each vehicle 200, and diagnosing an abnormality in a battery provided in each vehicle 200 based on the maximum voltage difference change rate of the battery cell for the accumulated driving distance of each vehicle 200 and the threshold value corresponding to the maximum voltage difference change rate.

Hereinafter, the operation of the controller 40 will be described in detail.

The controller 40 may collect the vehicle state information and the battery state information from the plurality of vehicles 200 through the communication device 20. In this case, the vehicle state information may include the charging, parking, driving, and accumulated driving distance, and the battery state information may include a voltage, a current, and a temperature of the battery cell.

The controller 40 may determine the maximum voltage difference change rate of the battery cell according to the driving distance of each vehicle 200 based on the vehicle state information and the battery state information collected from each vehicle 200.

For example, when the maximum voltage of the battery cell is $V_{max1}$ and the minimum voltage is $V_{min1}$ in a state where the accumulated driving distance of a first vehicle is 1,000 km, the maximum voltage difference becomes $V_{diff1}$ ($=V_{max1}-V_{min1}$). When the maximum voltage of the battery cell is $V_{max2}$ and the minimum voltage is $V_{min2}$ in a state in which the accumulated driving distance of the first vehicle is 1,100 km, the maximum voltage difference becomes $V_{diff2}(=V_{max2}-V_{min2})$. In this case, the controller 40 may determine the maximum voltage difference change rate 'R' of the battery cell according to the driving distance based on the following Equation 1.

$$R = \frac{V_{diff2} - V_{diff1}}{ODO_2 - ODO_1} \qquad \text{[Equation 1]}$$

Where the $ODO_1$ denotes the previous accumulated driving distance and the $ODO_2$ denotes the current accumulated driving distance. Accordingly, the result of subtracting $ODO_1$ from $ODO_2$ is the actual driving distance of the first vehicle. The value of 'R' determined in this manner is the value of 'R' at the accumulated driving distance of 1,100 km.

The controller 40 may diagnose the abnormality in the battery 210 provided in each vehicle 200 based on the maximum voltage difference change rate of the battery cell for each accumulated driving distance of each vehicle 200 and the corresponding threshold value. That is, the controller 40 may determine the threshold value corresponding to the state (charging, driving or parking) of each vehicle 200 and the accumulated driving distance, compare the maximum voltage difference change rate of the battery cell for each accumulated driving distance of each vehicle 200 with the threshold value corresponding to each vehicle 200, and diagnose that there is an abnormality in the battery 210 of the vehicle exceeding the threshold value. In this case, the controller 40 may predict that an abnormality will occur in the battery 210. As an example, FIG. 3A illustrates the maximum voltage difference of a battery cell of a normal vehicle for each date, and FIG. 3B illustrates the maximum voltage difference of a battery cell of an abnormal vehicle for each date.

Figure 3A:
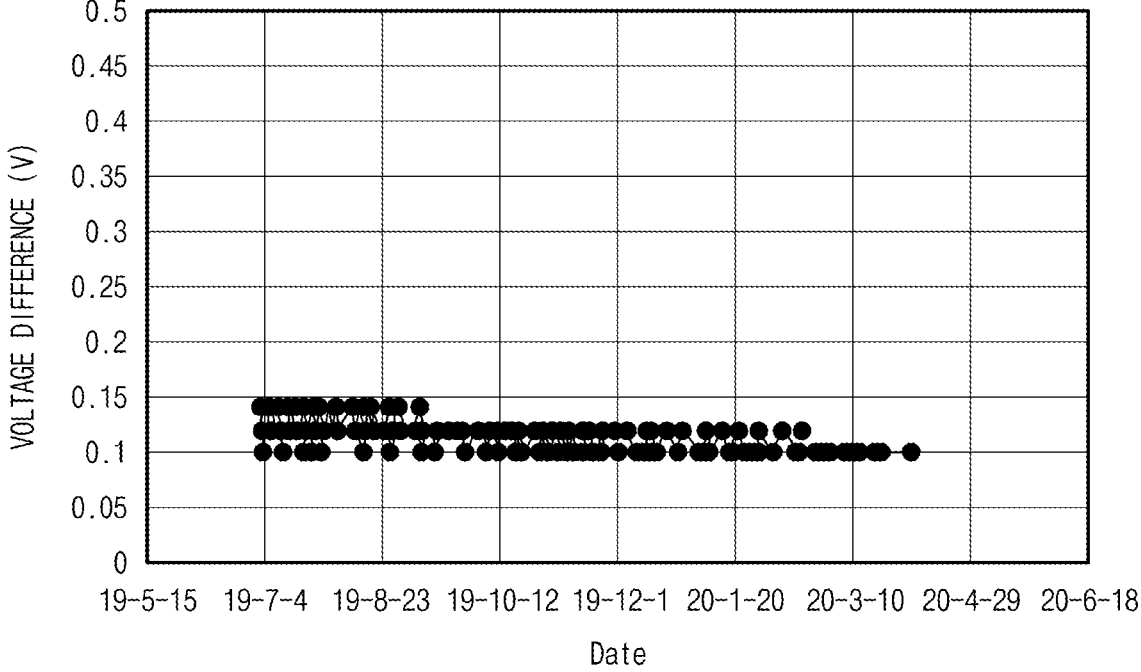
FIG. 3A is a view illustrating the maximum voltage difference of the battery cell of the vehicle for each date, which is determined as normal by a controller provided in an apparatus for diagnosing a battery of a vehicle according to an exemplary embodiment of the present disclosure.
Figure 3B:
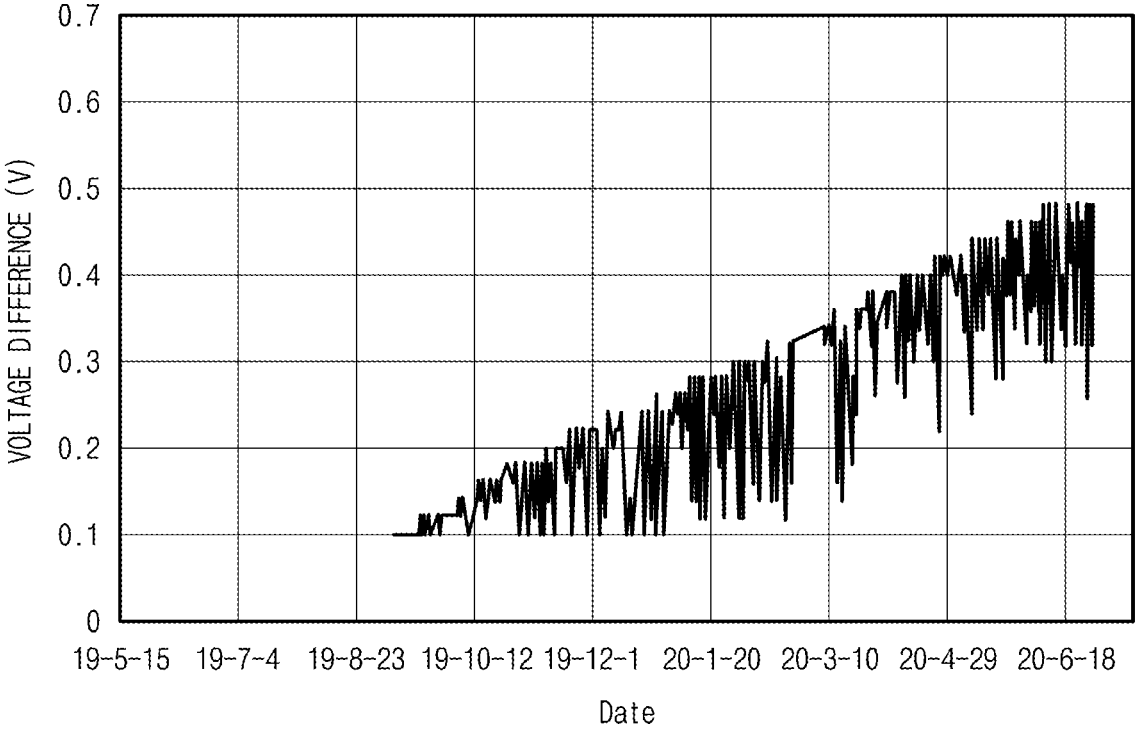
FIG. 3B is a view illustrating the maximum voltage difference of the battery cell of the vehicle for each date, which is determined as abnormal by a controller provided in an apparatus for diagnosing a battery of a vehicle according to an exemplary embodiment of the present disclosure.

As shown in FIG. 3A, it may be understood that the maximum voltage difference of a battery cell of a normal vehicle for each date is maintained in a specified range. Meanwhile, as shown in FIG. 3B, it may be understood that the maximum voltage difference of a battery cell of an abnormal vehicle for each date increases rapidly.

The controller 40 may perform a process of diagnosing a battery 210 when the SOC of the battery 210 satisfies a reference range (e.g., 20 to 100%), the temperature of the battery 210 satisfies a reference range (e.g., 10 to 50° C.), and the current of the battery 210 satisfies a reference range (e.g., −100 to 100 A).

The controller 40 may perform the process of diagnosing the battery 210 when the SOC of the battery 210 satisfies at least one of a reference range (e.g., 20 to 100%), the temperature of the battery 210 satisfies a reference range (e.g., 10 to 50° C.), or the current of the battery 210 satisfies a reference range (e.g., −100 to 100 A).

The controller 40 may perform the process of diagnosing the battery 210 when the driving distance of the vehicle 200 exceeds a reference distance (e.g., 100 km). For example, when the controller 40 performs the diagnosis process at the accumulated driving distance of the vehicle 200 at 1,000 km, the next diagnosis process may be performed at 1,100 km.

FIG. 4 is a flowchart illustrating a method of diagnosing a battery of a vehicle according to an exemplary embodiment of the present disclosure.

First, in 401, the storage 10 stores the threshold value for each accumulated driving distance section corresponding to the state of a vehicle. In this case, the storage 10 may store a threshold value for each accumulated driving distance section applied when the vehicle is driving, a threshold value for each accumulated driving distance section applied when the vehicle is charging, and a threshold value for each accumulated driving distance section applied when the vehicle is being parked.

Thereafter, in 402, the controller 40 may collect vehicle state information and battery state information from the plurality of vehicles 200.

Thereafter, in 403, the controller 40 may determine the maximum voltage difference change rate of the battery cell for each accumulated driving distance for each vehicle 200. In this case, the controller 40 periodically determines the difference between the maximum voltage and the minimum voltage of the battery cell as the maximum voltage difference. That is, the difference between the maximum voltage and the minimum voltage of the battery cell at the previous time point k−1 is determined as the maximum voltage difference, and the difference between the maximum voltage and the minimum voltage of the battery cell at the current time point 1' is determined as the maximum voltage difference. In addition, the controller 40 divides the difference between the maximum voltage difference at the present time point and the maximum voltage difference at the previous time point by the difference between the accumulated driving distance at the current time point and the accumulated driving distance at the previous time point. The dividing result becomes the maximum voltage difference change rate of the battery cell corresponding to the accumulated driving distance at the present time point.

Thereafter, in 404, the controller 40 may diagnose the abnormality of the battery 210 provided in each vehicle 200 based on the maximum voltage difference change rate of the battery cell for each accumulated driving distance of each vehicle 200 and the corresponding threshold value.

Figure 5:
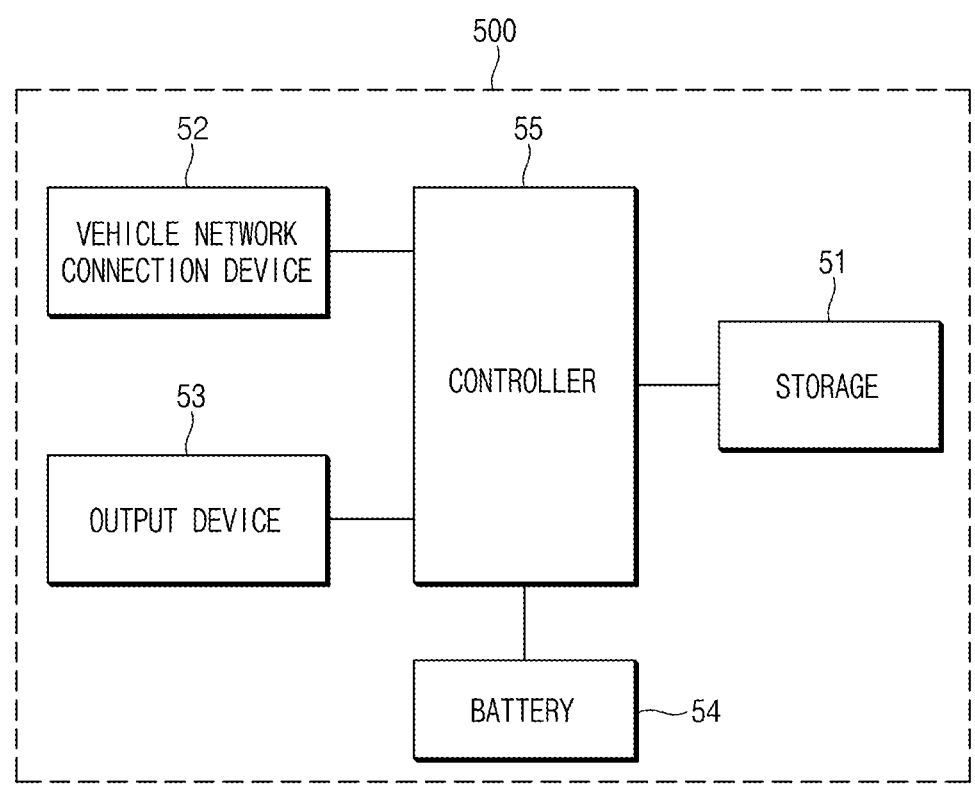
FIG. 5 is a block diagram illustrating an apparatus for diagnosing a battery of a vehicle according to another embodiment of the present disclosure.

FIG. 5 is a block diagram illustrating an apparatus for diagnosing a battery of a vehicle according to another embodiment of the present disclosure, which may be provided in each vehicle 200.

As shown in FIG. 5, an apparatus 500 for diagnosing a battery of a vehicle according to another embodiment of the present disclosure may include storage 51, a vehicle network connection device 52, an output device 53, a battery 54, and a controller 55. In this case, depending on a scheme of implementing the apparatus 500 for diagnosing a battery of a vehicle according to another embodiment of the present disclosure, components may be combined with each other to be implemented as one, or some components may be omitted.

Regarding each component, the storage 51 may store various logic, algorithms and programs required in the processes of providing a threshold value for each accumulated driving distance section corresponding to the state of a vehicle, collecting vehicle state information and battery state information through the vehicle network connection device 52, determining the maximum voltage difference change rate of the battery cell for each accumulated driving distance of the vehicle, and diagnosing an abnormality of the battery 54 based on the maximum voltage difference change rate of the battery cell for each accumulated driving distance of the vehicle and the corresponding threshold value.

The storage 51 may store the maximum voltage difference change rate of the battery cell for each accumulated driving distance of a vehicle (host vehicle). The storage 51 may store the history of the maximum voltage difference change rate of the battery cell for each accumulated driving distance of the vehicle.

The storage 10 may store a graph or table in which a threshold value for each accumulated driving distance section corresponding to a vehicle state is recorded. That is, the storage 51 may store a threshold value for each accumulated driving distance section applied when the vehicle is driving, a threshold value for each accumulated driving distance section applied when the vehicle is charging, and a threshold value for each accumulated driving distance section applied when the vehicle is being parked.

The storage 51 may include at least one type of a storage medium of memories of a flash memory type, a hard disk type, a micro type, a card type (e.g., a secure digital (SD) card or an extreme digital (XD) card), and the like, and a random access memory (RAM), a static RAM, a read-only memory (ROM), a programmable ROM (PROM), an electrically erasable PROM (EEPROM), a magnetic memory (MRAM), a magnetic disk, and an optical disk type memory.

The vehicle network connection device 52, which is a module that provides a connection interface with the vehicle network, may include a controller area network (CAN), a controller area network with flexible data-rate (CAN FD), a local interconnect network (LIN), FlexRay, media oriented systems transport (MOST), Ethernet, and the like.

The output device 53, which is a module for warning of an abnormality of the battery 54, may include a visual warning module and an audible warning module.

The battery 54 may include a high-voltage battery that provides driving power of an electric vehicle and a low-voltage battery that provides power to a vehicle electric component load.

The controller 55 may perform overall control such that each component performs its function. The controller 55 may be implemented in the form of hardware or software, or may be implemented in a combination of hardware and software. Preferably, the controller 55 may be implemented as a microprocessor, but is not limited thereto.

In particular, the controller 55 may perform various controls required in the processes of providing a threshold value for each accumulated driving distance section corresponding to the state of the vehicle, collecting the vehicle state information and the battery state information through the vehicle network connection device 52, determining the maximum voltage difference change rate of a battery cell for each accumulated driving distance of the vehicle, and diagnosing an abnormality of the battery 54 based on the maximum voltage difference change rate of the battery cell for each accumulated driving distance of the vehicle and the corresponding threshold value.

Hereinafter, the operation of the controller 55 will be described in detail. For reference, the controller 55 may perform the same function of the controller 40 described in the embodiment.

The controller 55 may collect the vehicle state information and the battery state information through the vehicle network connection device 52. In this case, the vehicle state information may include the charging, parking, driving, and accumulated driving distance, and the battery state information may include a voltage, a current, and a temperature of the battery cell.

The controller 55 may determine the maximum voltage difference change rate of the battery cell according to the accumulated driving distance of the vehicle based on the vehicle state information and the battery state information collected through the vehicle network connection device 52.

The controller 55 may diagnose the abnormality of the battery 54 based on the maximum voltage difference change rate of the battery cell for each accumulated driving distance of the vehicle and the corresponding threshold value. That is, the controller 55 may determine the threshold value corresponding to the state of a vehicle (host vehicle) and the accumulated driving distance, compare the maximum voltage difference change rate of the battery cell corresponding to the accumulated driving distance of the vehicle with the threshold value and diagnose that there is an abnormality in the battery 54 when exceeding the threshold value. In this case, the controller 55 may lower the threshold value to predict that an abnormality will occur in the battery 54.

The controller 55 may perform a process of diagnosing the battery 54 when the SOC of the battery 54 satisfies a reference range (e.g., 20 to 100%), the temperature of the battery 54 satisfies a reference range (e.g., 10 to 50° C.), and the current of the battery 54 satisfies a reference range (e.g., −100 to 100 A).

The controller 55 may perform the process of diagnosing the battery 54 when the SOC of the battery 54 satisfies at least one of a reference range (e.g., 20 to 100%), the temperature of the battery 54 satisfies a reference range (e.g., 10 to 50° C.), or the current of the battery 54 satisfies a reference range (e.g., −100 to 100 A).

The controller 55 may perform the process of diagnosing the battery 54 when the driving distance of the vehicle exceeds a reference distance (e.g., 1000 km). For example, when the controller 55 performs the diagnosis process at the accumulated driving distance of the vehicle at 1,000 km, the next diagnosis process may be performed at 1,100 km.

FIG. 6 is a flowchart illustrating a method of diagnosing a battery of a vehicle according to an exemplary embodiment of the present disclosure.

First, in 601, the storage 51 stores the threshold value for each accumulated driving distance section corresponding to the state of a vehicle. In this case, the storage 51 may store a threshold value for each accumulated driving distance section applied when the vehicle is driving, a threshold value for each accumulated driving distance section applied when the vehicle is charging, and a threshold value for each accumulated driving distance section applied when the vehicle is being parked.

Thereafter, in 602, the controller 55 may collect vehicle state information and battery state information through the vehicle network connection device 52.

Thereafter, in 603, the controller 55 may determine the maximum voltage difference change rate of the battery cell for each accumulated driving distance of the vehicle based on the vehicle state information and the battery state information.

Thereafter, in 604, the controller 55 may diagnose the abnormality of the battery 54 provided in the vehicle based on the maximum voltage difference change rate of the battery cell for each accumulated driving distance of the vehicle and the corresponding threshold value.

Figure 7:
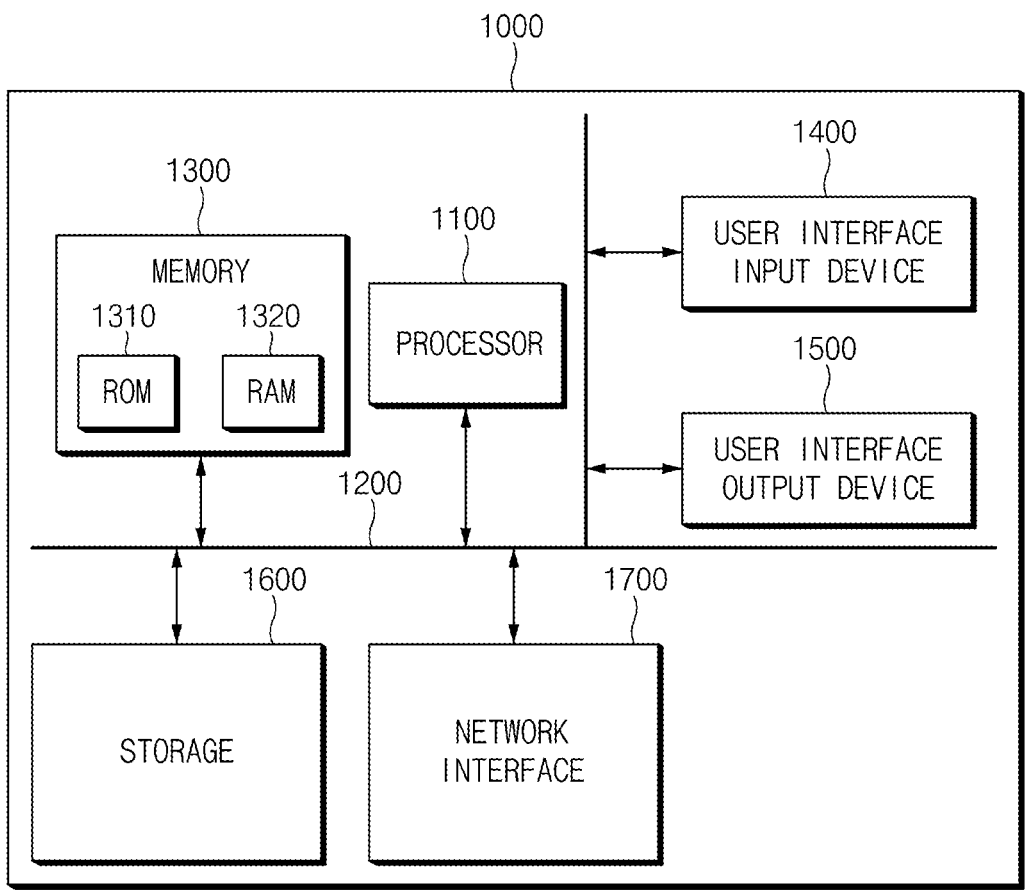
FIG. 7 is a block diagram illustrating a computing system for executing a method of diagnosing a battery of a vehicle according to an exemplary embodiment of the present disclosure.

FIG. 7 is a block diagram illustrating a computing system for executing a method of diagnosing a battery of a vehicle according to an exemplary embodiment of the present disclosure.

Referring to FIG. 7, a method of diagnosing a battery of a vehicle according to an exemplary embodiment of the present disclosure described above may be implemented through a computing system. A computing system 1000 may include at least one processor 1100, a memory 1300, a user interface input device 1400, a user interface output device 1500, storage 1600, and a network interface 1700 connected through a system bus 1200.

The processor 1100 may be a central processing device (CPU) or a semiconductor device that processes instructions stored in the memory 1300 and/or the storage 1600. The memory 1300 and the storage 1600 may include various types of volatile or non-volatile storage media. For example, the memory 1300 may include a ROM (Read Only Memory) 1310 and a RAM (Random Access Memory) 1320.

Accordingly, the processes of the method or algorithm described in relation to the embodiments of the present disclosure may be implemented directly by hardware executed by the processor 1100, a software module, or a combination thereof. The software module may reside in a storage medium (that is, the memory 1300 and/or the storage 1600), such as a RAM, a flash memory, a ROM, an EPROM, an EEPROM, a register, a hard disk, solid state drive (SSD), a detachable disk, or a CD-ROM. The exemplary storage medium is coupled to the processor 1100, and the processor 1100 may read information from the storage medium and may write information in the storage medium. In another method, the storage medium may be integrated with the processor 1100. The processor and the storage medium may reside in an application specific integrated circuit (ASIC). The ASIC may reside in a user terminal. In another method, the processor and the storage medium may reside in the user terminal as an individual component.

As described above, the apparatus and method for diagnosing a battery of a vehicle capable of diagnosing in advance a defect (faulty or lemon) in a battery that may cause a fire in the vehicle by providing a threshold value for each accumulated driving distance section corresponding to the state of the vehicle, collecting vehicle state information and battery state information from a plurality of vehicles, determining the maximum voltage difference change rate of the battery cell for each accumulated driving distance for each vehicle, and diagnosing an abnormality in the battery provided in each vehicle based on a maximum voltage difference change rate of a battery cell for each accumulated driving distance of each vehicle and a corresponding threshold value.

Although exemplary embodiments of the present disclosure have been described for illustrative purposes, those skilled in the art will appreciate that various modifications, additions and substitutions are possible, without departing from the scope and spirit of the disclosure.

Therefore, the exemplary embodiments disclosed in the present disclosure are provided for the sake of descriptions, not limiting the technical concepts of the present disclosure, and it should be understood that such exemplary embodiments are not intended to limit the scope of the technical concepts of the present disclosure. The protection scope of the present disclosure should be understood by the claims below, and all the technical concepts within the equivalent scopes should be interpreted to be within the scope of the right of the present disclosure.

What is claimed is:

1. A method of diagnosing a battery of a vehicle, the method comprising:

recording, by an odometer, an accumulated driving distance of the vehicle;

storing, by storage, a threshold value for each of a plurality of sections of the accumulated driving distance corresponding to a state of the vehicle;

measuring, by a battery module, battery state information including at least one of voltage, current, or temperature of a battery cell of the vehicle battery, collecting, by a controller, vehicle state information and the battery state information;

determining, by the controller, a maximum voltage difference change rate of the battery cell for an accumulated driving distance for the vehicle; and diagnosing, by the controller, an abnormality in the vehicle battery based on the maximum voltage difference change rate of the battery cell for the accumulated driving distance of the vehicle and a threshold value corresponding to the maximum voltage difference change rate;

wherein determining of the maximum voltage difference rate by the controller comprises:

determining a difference between a maximum voltage and a minimum voltage of the battery cell at a first time as a first maximum voltage difference;

determining a difference between a maximum voltage and a minimum voltage of the battery cell at a second time as a second maximum voltage difference; and obtaining the voltage difference change rate by dividing a difference between the second maximum voltage difference and the first maximum voltage difference by a difference between a cumulative mileage at the second time and a cumulative mileage at the first time;

wherein the voltage difference change rate corresponds to the cumulative mileage at the second time; and outputting, by an output device including a processor, at least one of a visual warning or an audible warning of the diagnosed abnormality.

2. The method of claim 1, wherein the collecting of the vehicle state information and the battery state information comprises:

collecting, by the controller, at least one of charging, parking, driving and the accumulated driving distance as the vehicle state information.

3. The method of claim 1, wherein the diagnosing of the abnormality comprises:

determining, by the controller, a threshold value corresponding to the state of the vehicle and the accumulated driving distance;

comparing, by the controller, the maximum voltage difference change rate of the battery cell for the accumulated driving distance of the vehicle with the threshold value corresponding to the vehicle; and diagnosing, by the controller, that an abnormality occurs in the battery of the vehicle when the maximum voltage difference change rate exceeds the threshold value.

4. The method of claim 1, wherein the diagnosing of the abnormality comprises:

determining, by the controller, the diagnosing of the battery when a state of charge (SOC) of the battery satisfies a first reference range, a temperature of the battery satisfies a second reference range, and a current of the battery satisfies a third reference range.

5. An apparatus for diagnosing a battery of a vehicle, the apparatus comprising:

the battery;

a vehicle network connection device;

an odometer configured to record an accumulated driving distance of the vehicle;

storage configured to store a threshold value for each of a plurality of sections of the accumulated driving distance corresponding to a state of the vehicle;

a battery module configured to measure battery state information including at least one of voltage, current, or temperature of a battery cell of the vehicle battery; and a controller configured to:

collect vehicle state information and the battery state information through the vehicle network connection device, determine a maximum voltage difference change rate of the battery cell for an accumulated driving distance of the vehicle, and diagnose an abnormality in a battery based on the maximum voltage difference change rate of the battery cell for the accumulated driving distance of the vehicle and a threshold value corresponding to the maximum voltage difference change rate;

determine a difference between a maximum voltage and a minimum voltage of the battery cell at a first time as a first maximum voltage difference;

determine a difference between a maximum voltage and a minimum voltage of the battery cell at a second time as a second maximum voltage difference; and obtain the maximum voltage difference change rate by dividing a difference between the second maximum voltage difference and the first maximum voltage difference by a difference between a cumulative mileage at the second time and a cumulative mileage at the first time;

wherein the maximum voltage difference change rate corresponds to the cumulative mileage at the second time; and an output device including a processor and configured to provide at least one of a visual warning or an audible warning of the diagnosed abnormality.

6. The apparatus of claim 5, wherein the controller is further configured to collect at least one of charging, parking, driving and the accumulated driving distance as the vehicle state information.

7. The apparatus of claim 5, wherein the controller is further configured to determine a threshold value corresponding to the state of the vehicle and the accumulated driving distance, compare the maximum voltage difference change rate of the battery cell for the accumulated driving distance of the vehicle with the threshold value, and diagnose that an abnormality occurs in the battery when the maximum voltage difference change rate exceeds the threshold value.

8. The apparatus of claim 5, wherein the controller is further configured to diagnose the battery when a state of charge (SOC) of the battery satisfies a first reference range, a temperature of the battery satisfies a second reference range, and a current of the battery satisfies a third reference range.

* * * * *